(12) United States Patent
Lauer et al.

(10) Patent No.: US 8,796,735 B2
(45) Date of Patent: Aug. 5, 2014

(54) FABRICATION OF A VERTICAL HETEROJUNCTION TUNNEL-FET

(75) Inventors: Isaac Lauer, Mahopac, NY (US); Amlan Majumdar, White Plains, NY (US); Paul M. Solomon, Yorktown Heights, NY (US); Steven J. Koester, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 13/430,041

(22) Filed: Mar. 26, 2012

(65) Prior Publication Data

US 2012/0193678 A1 Aug. 2, 2012

Related U.S. Application Data

(63) Continuation of application No. 12/815,902, filed on Jun. 15, 2010, now Pat. No. 8,258,031.

(51) Int. Cl.
*H01L 29/66* (2006.01)
*H01L 21/336* (2006.01)
*H01L 29/165* (2006.01)
*H01L 29/739* (2006.01)

(52) U.S. Cl.
CPC .......... *H01L 29/165* (2013.01); *H01L 29/7391* (2013.01)
USPC .......................................... 257/192; 438/197

(58) Field of Classification Search
CPC ............. H01L 29/66545; H01L 29/7848; H01L 21/823814; H01L 21/823807; H01L 29/78; H01L 29/165; H01L 29/7391

USPC .......... 257/192, E29.262, E21.403; 438/192, 438/197, 142, 306
See application file for complete search history.

(56) References Cited

U.S. PATENT DOCUMENTS

| | | | |
|---|---|---|---|
| 4,675,711 | A | 6/1987 | Harder et al. |
| 4,870,469 | A | 9/1989 | Nishizawa et al. |
| 5,473,176 | A | 12/1995 | Kakumoto |
| 5,698,869 | A | 12/1997 | Yoshimi et al. |
| 5,834,793 | A | 11/1998 | Shibata |
| 6,198,113 | B1 | 3/2001 | Grupp |

(Continued)

FOREIGN PATENT DOCUMENTS

JP 5190847 A 7/1993
WO 2008/146157 A2 12/2008

OTHER PUBLICATIONS

Islam et al., "Off Current Modeling of a Tunnel Field Effect Transistor," 2012, 7th International Conference on Electrical and Computer Engineering, pp. 814-818, Dec. 20-22, 2012, Dhaka, Bangladesh.*

(Continued)

*Primary Examiner* — Nikolay Yushin
(74) *Attorney, Agent, or Firm* — Cantor Colburn LLP; Vazken Alexanian

(57) ABSTRACT

Exemplary embodiments include a method for fabricating a heterojunction tunnel field-effect-transistor (FET), the method including forming a gate region on a silicon layer of a silicon-on-insulator (SOI) substrate, forming a drain region on the silicon layer adjacent the gate region and forming a vertical heterojunction source region adjacent the gate region, wherein the vertical heterojunction source region generates a tunnel path inline with a gate field associated with the gate region.

11 Claims, 6 Drawing Sheets

(56) References Cited

U.S. PATENT DOCUMENTS

| | | |
|---|---|---|
| 6,424,005 B1 * | 7/2002 | Tsai et al. .................... 257/335 |
| 6,617,643 B1 | 9/2003 | Goodwin-Johansson |
| 6,680,240 B1 * | 1/2004 | Maszara ..................... 438/455 |
| 6,838,326 B2 | 1/2005 | Kwon |
| 7,057,216 B2 * | 6/2006 | Ouyang et al. ............... 257/194 |
| 7,074,662 B2 | 7/2006 | Lee et al. |
| 7,198,990 B2 | 4/2007 | Joshi et al. |
| 7,242,056 B2 | 7/2007 | Chaudhry et al. |
| 7,453,113 B2 | 11/2008 | Ouyang et al. |
| 7,465,976 B2 | 12/2008 | Kavalieros et al. |
| 8,178,400 B2 | 5/2012 | Chang et al. |
| 2006/0258072 A1 | 11/2006 | Kavalieros et al. |
| 2007/0178650 A1 | 8/2007 | Chen et al. |
| 2009/0026491 A1 | 1/2009 | Booth, Jr. et al. |

OTHER PUBLICATIONS

Woo Young et al., "Tunneling Field-Effect Transistors (TFETs) With Subthreshold Swing (SS) Less THan 60 mV/dec"; IEEE Electron Device Letters, IEEE Service Center, New York, NY, US vol. 28, No. 8, Aug. 1, 2007, pp. 743-745.

International Search Report & Written Opinion; International Application No. PCT/EP2011/055689; International Filing Date: Apr. 12, 2011; Date of Mailing: Jun. 21, 2011; 10 pages.

* cited by examiner

FABRICATION OF A VERTICAL HETEROJUNCTION TUNNEL-FET

CROSS-REFERENCE TO RELATED APPLICATIONS

This application is a continuation of U.S. patent application Ser. No. 12/815,902, filed Jun. 15, 2010, the disclosure of which is incorporated by reference herein in its entirety.

STATEMENT OF GOVERNMENT INTEREST

This invention was made with Government support under Contract No.: FA8650-08-C-7806 awarded by Defense Advanced Research Projects Agency (DARPA). The Government has certain rights in this invention.

BACKGROUND

The present invention relates to semiconductor fabrication, and more specifically, to systems and methods for fabricating a vertical heterojunction tunnel field effect transistor (FET) implementing a planar process.

Tunnel-FETs are proposed as a replacement for/complement to existing CMOS technology. Tunnel-FET structures with a heterojunction on the source side of the device are preferred since they can increase device performance while suppressing parasitic ambipolar behavior at the drain end. Existing tunnel-FET designs predominantly use a tunnel-junction perpendicular to the gate, rather than parallel, which reduces the effectiveness of the gate field. Other designs which use a gate-parallel tunnel path either do not have a heterojunction or have one which also exists on the drain side, increasing parasitic ambipolar current.

SUMMARY

Exemplary embodiments include a method for fabricating a heterojunction tunnel field-effect-transistor (FET), the method including forming a gate region on a silicon layer of a silicon-on-insulator (SOI) substrate, forming a drain region on the silicon layer adjacent the gate region and forming a vertical heterojunction source region adjacent the gate region, wherein the vertical heterojunction source region generates a tunnel path inline with a gate field associated with the gate region.

Additional embodiments include a method for fabricating a heterojunction tunnel field-effect-transistor (FET), the method including forming a gate region on a silicon layer of a silicon-on-insulator (SOI) substrate, forming an n-type drain region on the silicon layer adjacent the gate region and forming a vertical heterojunction source region adjacent the gate region, wherein the vertical heterojunction source region includes a p-type source region layer disposed between a first n-type semiconductor layer and a second n-type semiconductor layer.

Additional embodiments include a field effect transistor (FET) device, including a silicon-on-insulator (SOI) substrate, a gate region disposed on the SOI substrate, a drain region adjacent the gate region and a vertical heterojunction source region adjacent the gate region, wherein the vertical heterojunction source region generates a tunnel path inline with a gate field associated with the gate region.

Further exemplary embodiments include a field effect transistor (FET) device, including a silicon-on-insulator (SOI) substrate, including a silicon substrate layer, a buried oxide layer disposed on the silicon substrate layer and a silicon layer disposed on the buried oxide layer, wherein a portion of the silicon layer is n-type and disposed in a vertical heterojunction source region, an oxide layer disposed on the silicon layer, a gate disposed on the oxide layer and encapsulated in spacers and a hardmask, an n-type drain region adjacent the gate region, a p-type source region partially disposed underneath the portion of the n-type silicon layer and an n-type silicon layer disposed underneath the p-type source region, wherein the vertical heterojunction source region generates a tunnel path inline with a gate field associated with the gate region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include an apparatus and method for fabricating a heterojunction tunnel-FET with the tunnel-path in-line with the gate, fabricated in a planar process, which gives a gate-parallel tunnel path with a source-side only heterojunction. The exemplary embodiments described herein include tunnel-FETs as a replacement for/complement to MOSFETs. In exemplary embodiments, a heterojunction at the source allows a low effective band-gap at the source injection point, while maintaining a high band-gap at the drain side, which suppresses parasitic ambipolar behavior. Exemplary embodiments further include tunneling-paths in-line with the gate field.

Figure 1:
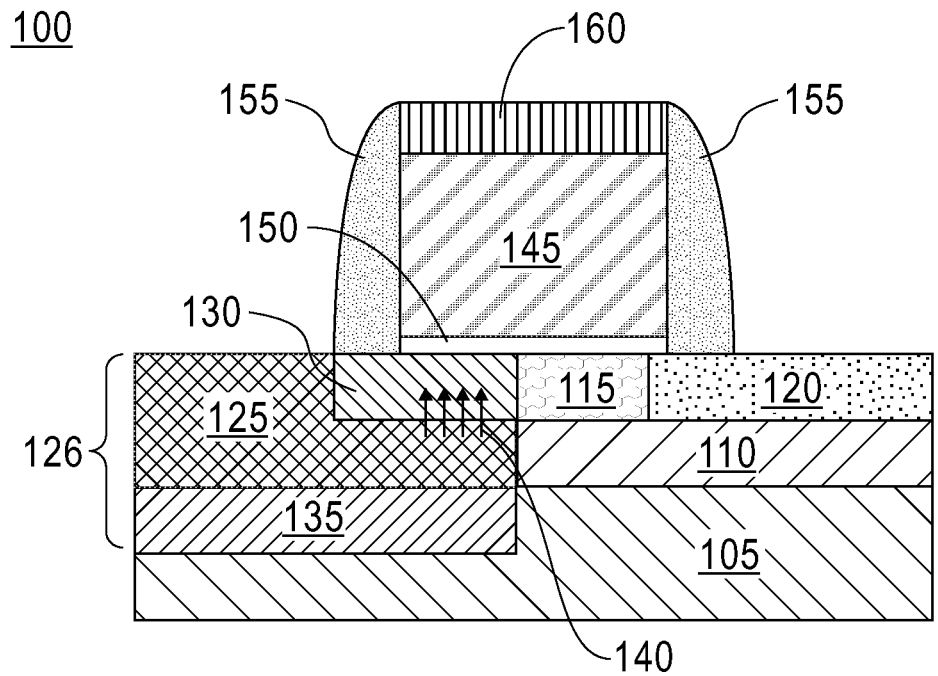
FIG. 1 illustrates an exemplary vertical heterojunction tunnel-FET fabricated in accordance with exemplary embodiments.

FIG. 1 illustrates an exemplary vertical heterojunction tunnel-FET device 100 fabricated in accordance with exemplary embodiments. In exemplary embodiments, the device 100 can include a silicon substrate 105. As described further herein, the silicon substrate 105 can be a portion of a silicon-on-insulator (SOI) device, that can include a buried oxide layer 110 (e.g., $SiO_2$) and a layer of silicon 115. The device 100 can further include a drain region 120, which can be an N+ Si drain.

The device 100 can further include a source region 125, which can be a P+ SiGe source. In exemplary embodiments, the source region 125 is a portion of a heterojunction source including the source region 125, a semiconductor region 130 of a differing semiconductor material than the source region 125, and a semiconductor region 135 of a differing semiconductor material than the source region. In exemplary embodiments, the semiconductor regions 130, 135 are similar semiconducting materials as further described herein. Similarly, the semiconductor regions 130, 135 may be the same semiconducting materials at the drain region 120. In the example of FIG. 1. the source region is P+ SiGe and the semiconductor regions (as well as the drain region) are N+ Si. As described herein, the vertical heterojunction including the source region 125 sandwiched between the semiconductor regions 130, 135 generates a low effective band gap at the source injection point, while maintaining a high band gap at the drain region 120, thereby suppressing parasitic ambipolar behavior. In addition, the vertical heterojunction 126 generates a tunnel path 140 inline with a gate field, which is a desirable quality over tunneling paths that occur at an angle as in the prior art, as further discussed herein. In exemplary embodiments, the device 100 further includes a gate 145 disposed on an insulating layer 150 (e.g., an oxide layer). In exemplary embodiments, the gate can include spacers 155 and a hardmask 160. As known in the art, the spacers 155 and hardmask can be implemented to pattern the gate 145 during fabrication of the device 100 and can be any suitable material including but not limited to silicon nitride. In another example, the gate spacers may have a multilayer structure and may include silicon oxide, silicon nitride, silicon oxynitride, or other dielectric material. In exemplary embodiments, the spacers 155 and the hardmask 160 of the gate 145 are formed to protect the gate 145 during manufacturing processing. The encapsulation can avoid oxidation of gate 145, and also facilitate repairing or restoring stoichiometry of the gate 145 that may be damaged or altered during gate patterning.

Figure 2:
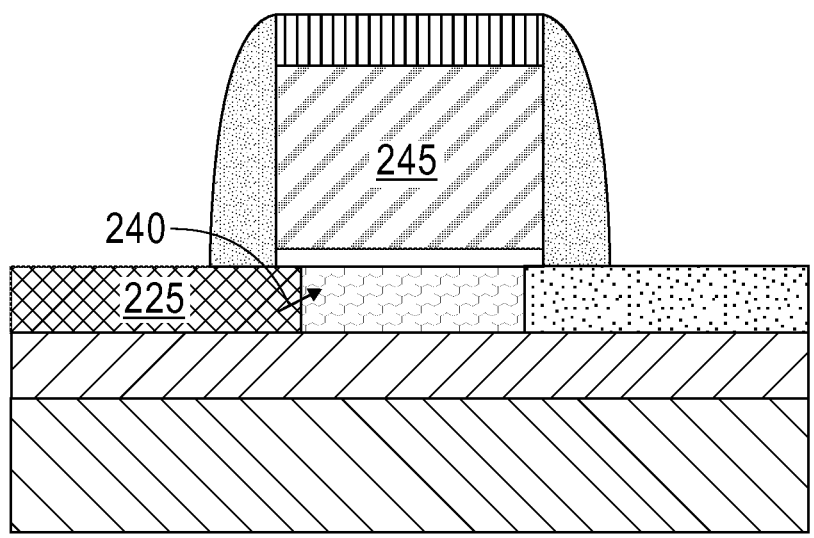
FIG. 2 illustrates a conventional corner device.
Figure 3:
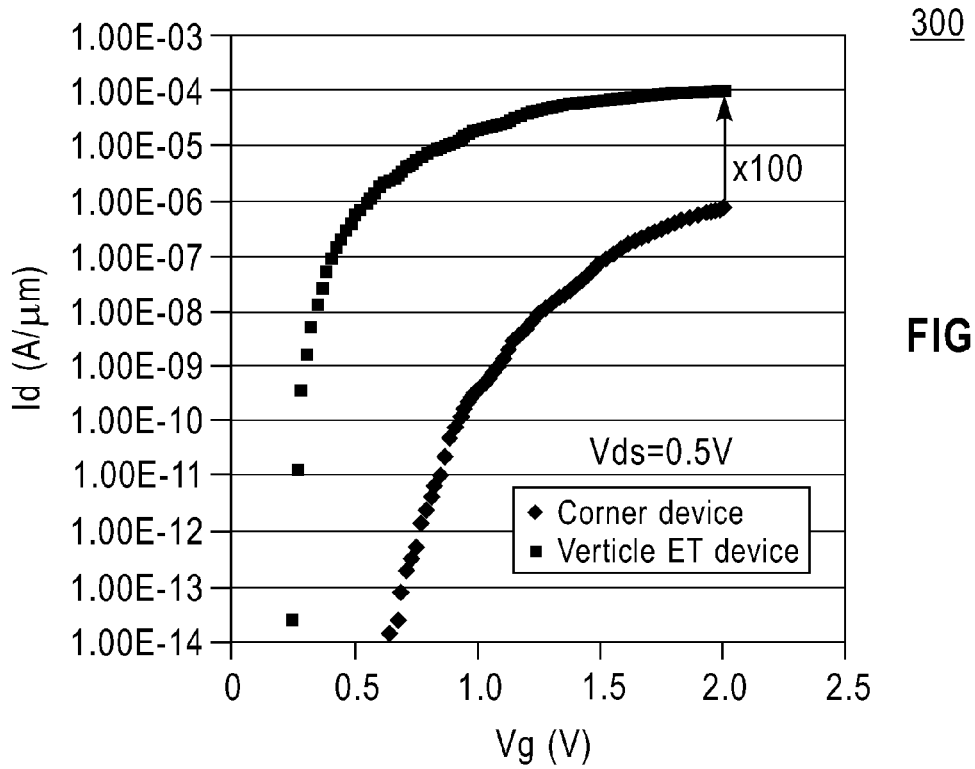
FIG. 3 illustrates a Id-Vg plot.
Figure 4:
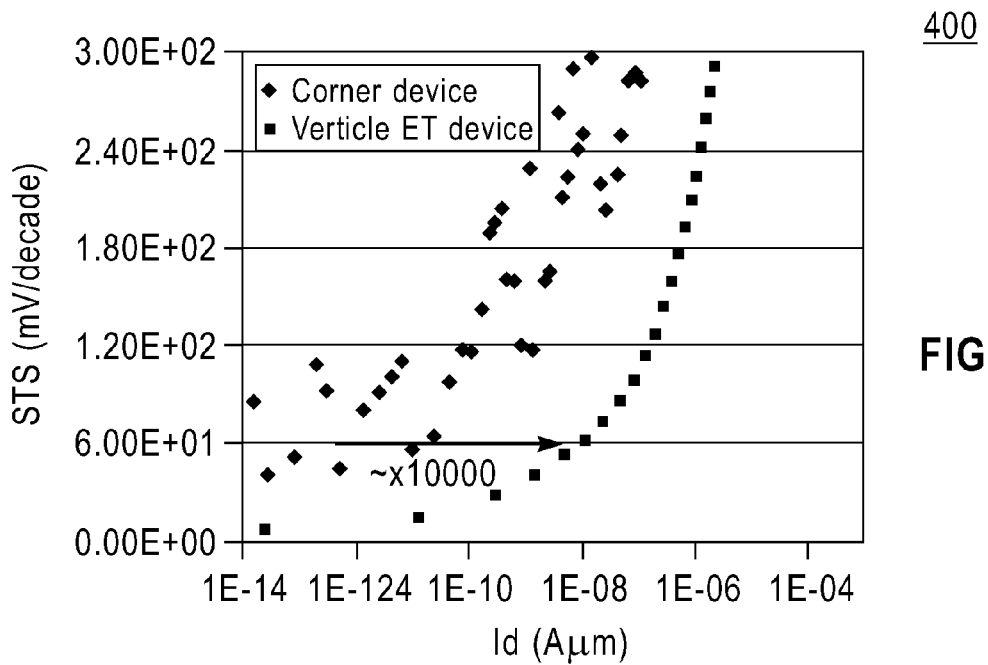
FIG. 4 illustrates a plot of subthreshold slope (STS) versus drain current

As discussed above, the vertical heterojunction generates a tunnel path 140 inline with a gate field. FIG. 2 illustrates a conventional corner device 200 in which a tunnel path 240 is generated from the source 225 to the gate 245 at an angle with respect to the gate 245. FIG. 3 illustrates an Id-Vg plot 300 comparing the exemplary device 100 and the conventional device 200, thereby illustrating advantages of having the tunnel path 140 inline with the gate filed as opposed to a tunnel path 240 at an angle with respect to the gate 245. As plotted, for the exemplary device, as the gate voltage Vg is increased, the drain current Id is higher by as much as 100 times that of a given gate voltage for the conventional device 200. FIG. 4 illustrates a plot 400 of subthreshold slope (STS) versus drain current for both the exemplary device 100 and the conventional device. As illustrated, for a given STS, the exemplary device has as much as a 10,000 times increase in drain current.

Figure 5:
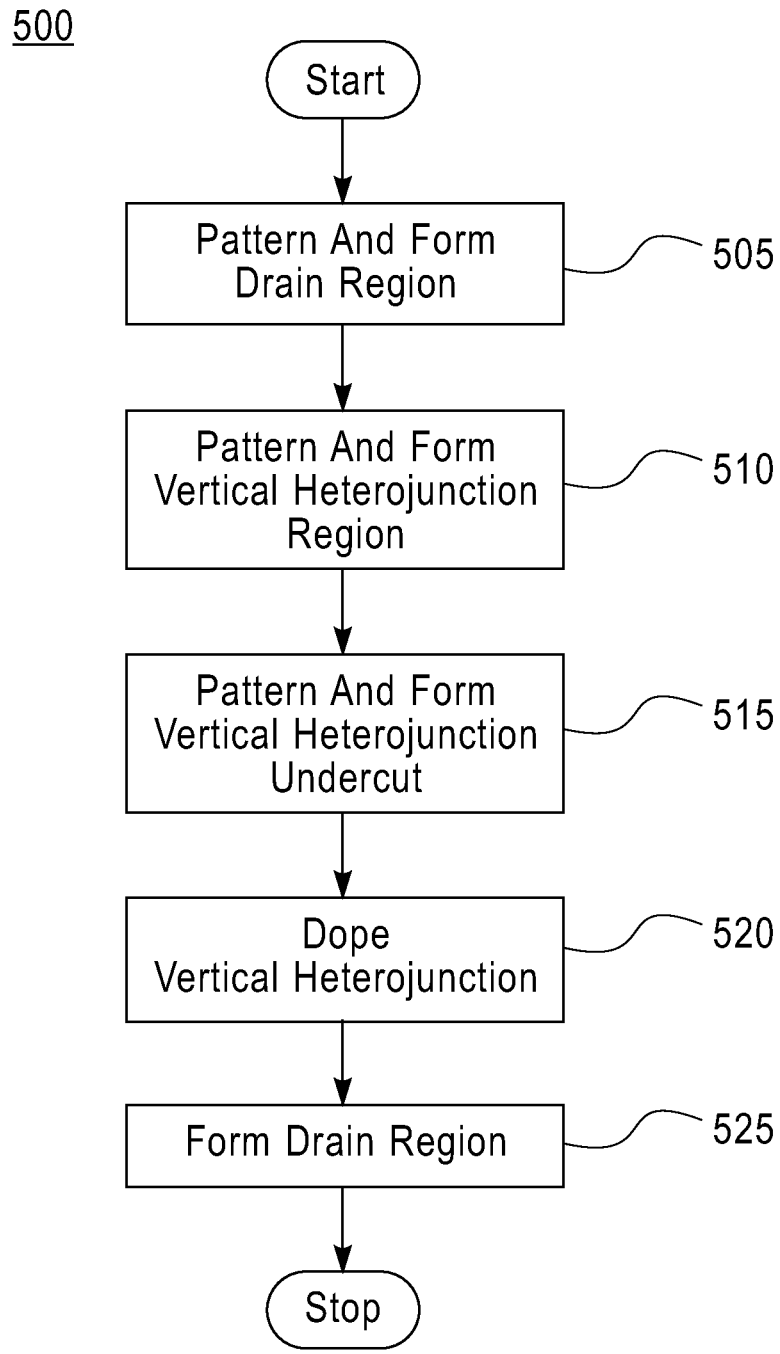
FIG. 5 illustrates a flow chart for a method for fabricating a vertical heterojunction tunnel FET in accordance with exemplary embodiments

Exemplary methods for fabricating the device 100 are now discussed. FIG. 5 illustrates a flow chart for a method 500 for fabricating a vertical heterojunction tunnel FET in accordance with exemplary embodiments. In exemplary embodiments, those skilled in the art will appreciate that the exemplary FETs described herein can be fabricated with standard CMOS processes. FIGS. 6-11 illustrate resulting intermediate structures during each of the fabrication steps described herein.

Figure 6:
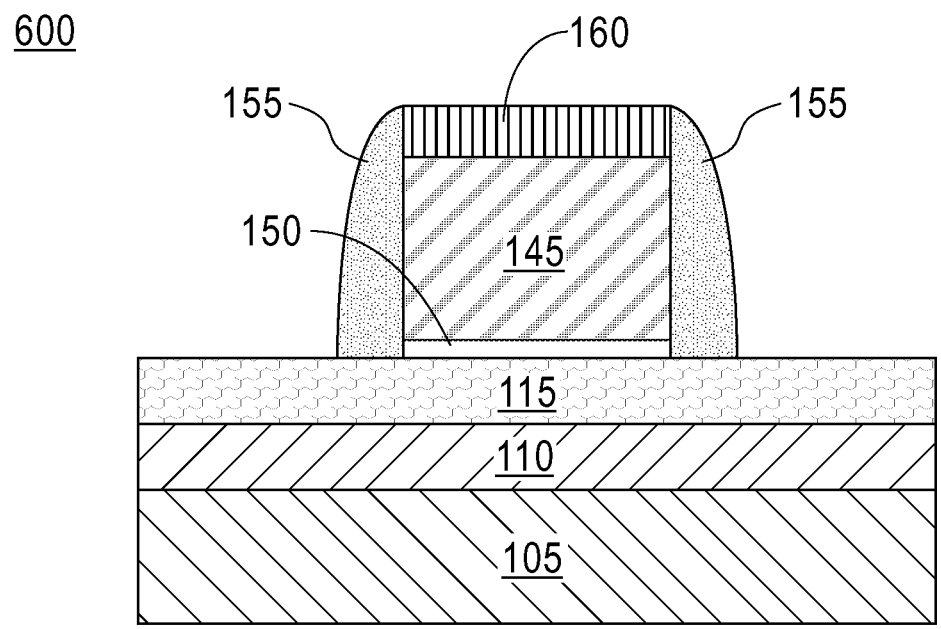
FIG. 6 illustrates an initial structure.
Figure 7:
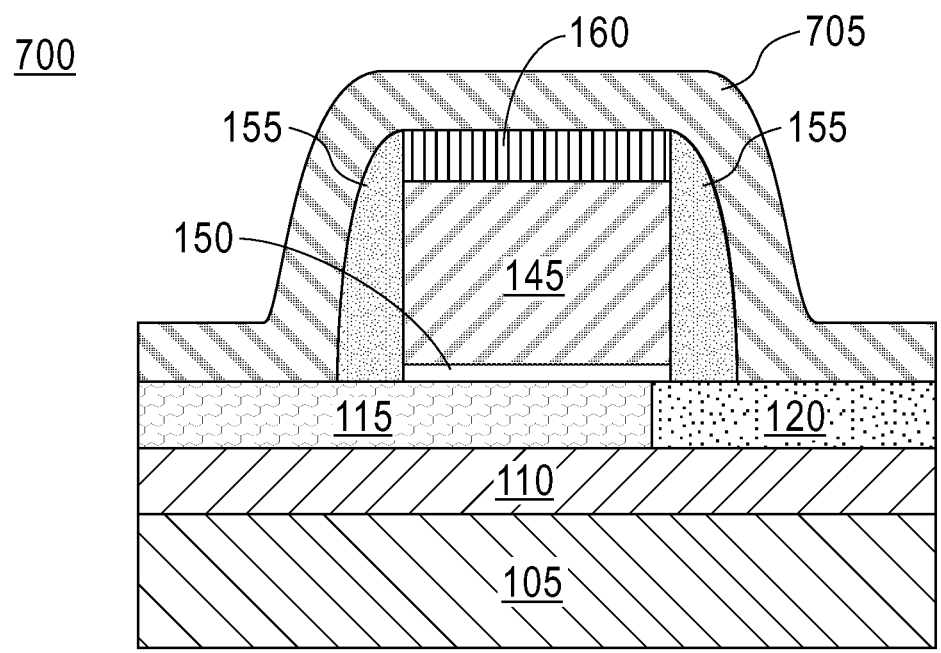
FIG. 7 illustrates an intermediate structure in which the drain region has been patterned and formed.

FIG. 6 illustrates an initial structure 600 having the encapsulated gate 145, surrounded by the spacers 155 and hardmask 160, on an SOI structure that includes the silicon substrate 105, the buried oxide layer 110 and the additional layer of silicon 115. In exemplary embodiments, the initial structure 600 can be fabricated with CMOS techniques known in the art. At block 505, standard masking and lithography techniques are implemented to mask the initial structure to pattern the drain region 120. FIG. 7 illustrates an intermediate structure 700 in which the drain region 120 has been patterned and formed. In exemplary embodiments, the drain region 120 is formed by implanting and annealing the drain region 120 with fabrication techniques known in the art. For example, the drain region 120 can be implanted with an n-type dopant species with an elements including but not limited to phosphorous, arsenic and antimony. Annealing can be performed to achieve the desired depth of the drain region 120. As such, the resulting N+ Si drain region 120 is formed. In exemplary embodiments, a nitride hardmask 705 can be deposited as part of the intermediate structure 700 as further illustrated in FIG. 7.

Figure 8:
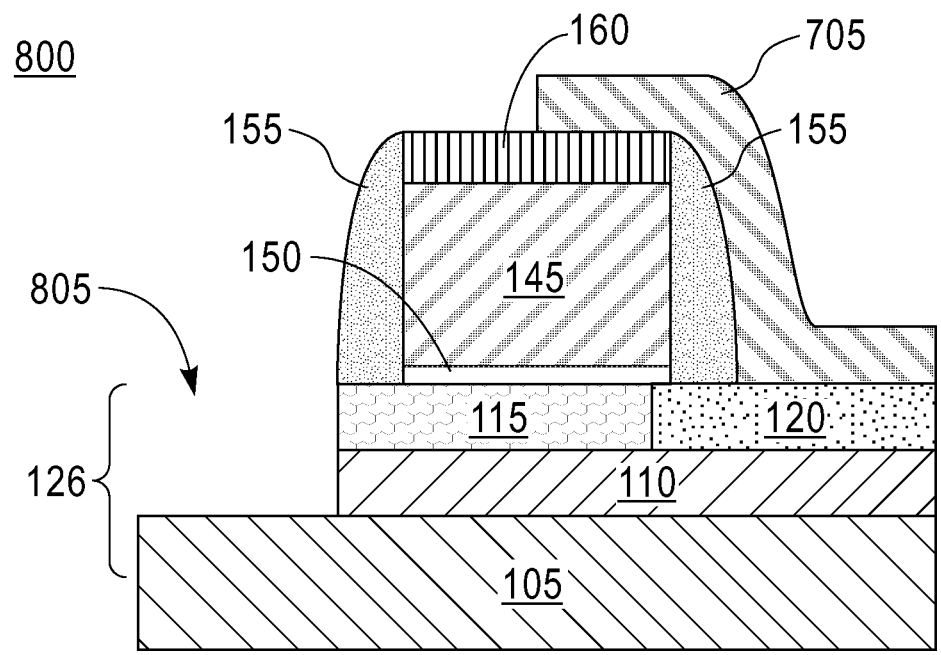
FIG. 8 illustrates an intermediate structure in which a region for the vertical heterojunction has been patterned and formed.

At block 510, standard masking and lithography techniques are implemented to mask the intermediate structure 700 of FIG. 7 to pattern the region to form the vertical heterojunction 126, and protect the gate 145, spacers 155, hardmask 160 and drain region 120. In exemplary embodiments, the hardmask 705 is patterned as well. In exemplary embodiments, the hardmask 705 can be patterned implementing standard masking and lithography techniques as well as anisotropic etching techniques such as reactive ion etching (RIE) to remove the hardmask 705 from the side of the intermediate structure 700 in which the source is to be fabricated. As further described herein, the hardmask protects the drain region 120 from subsequent growth steps. FIG. 8 illustrates an intermediate structure 800 in which a region 805 for the vertical heterojunction 126 has been patterned and formed. In exemplary embodiments, the region 805 is formed by etching through the buried oxide layer 110 and the silicon layer 155 with fabrication techniques known in the art. For example, the buried oxide layer 110 and the silicon layer 155 can be etched with an etching technique suitable for etching the two materials such as an anisotropic etch (e.g., RIE).

Figure 9:
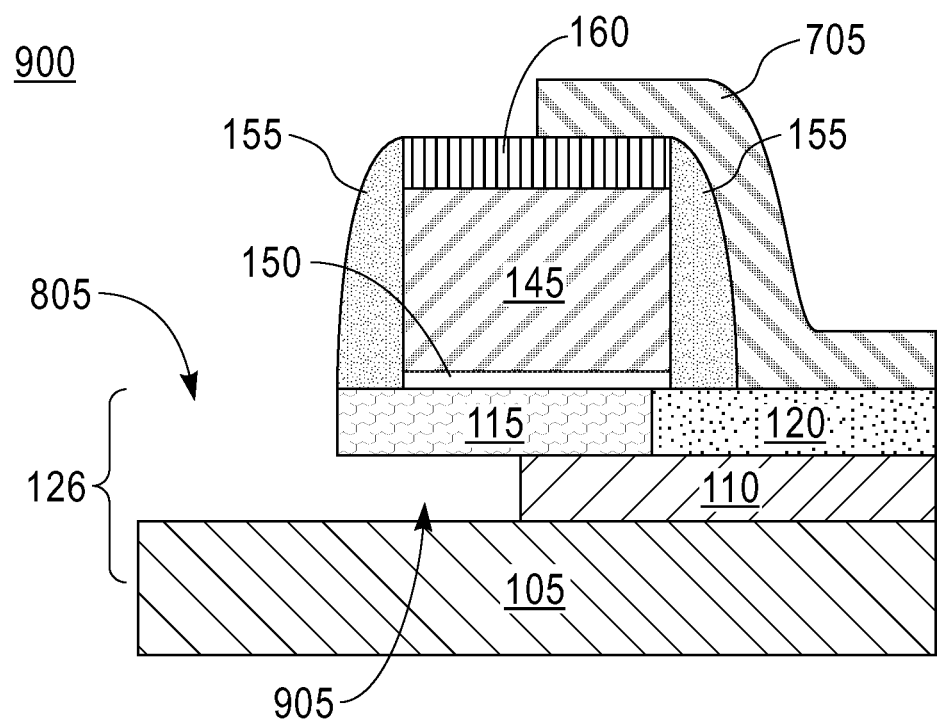
FIG. 9 illustrates an intermediate structure in which an undercut region for the source region has been patterned and formed.

At block 515, a source-side (heterojunction region 805) undercut etch is performed. The masking implemented at block 510 can be maintained to protect the gate 145, spacers 155, hardmask 160 and drain region 120. Alternatively, additional standard masking and lithography techniques can be implemented to mask the intermediate structure 800 of FIG. 8 to pattern the region to form the undercut etch. FIG. 9 illustrates an intermediate structure 900 in which an undercut region 905 for the source region 125 has been patterned and formed. In exemplary embodiments, the region 905 is formed by etching through the buried oxide layer 110 between the silicon substrate 105 and the silicon layer 115 by fabrication techniques known in the art. As such, an etchant capable of etching $SiO_2$ and not Si is desirable. For example, the buried oxide layer 110 can be etched a buffered oxide etch (BHF) with warm hydrofluoric acid.

Figure 10:
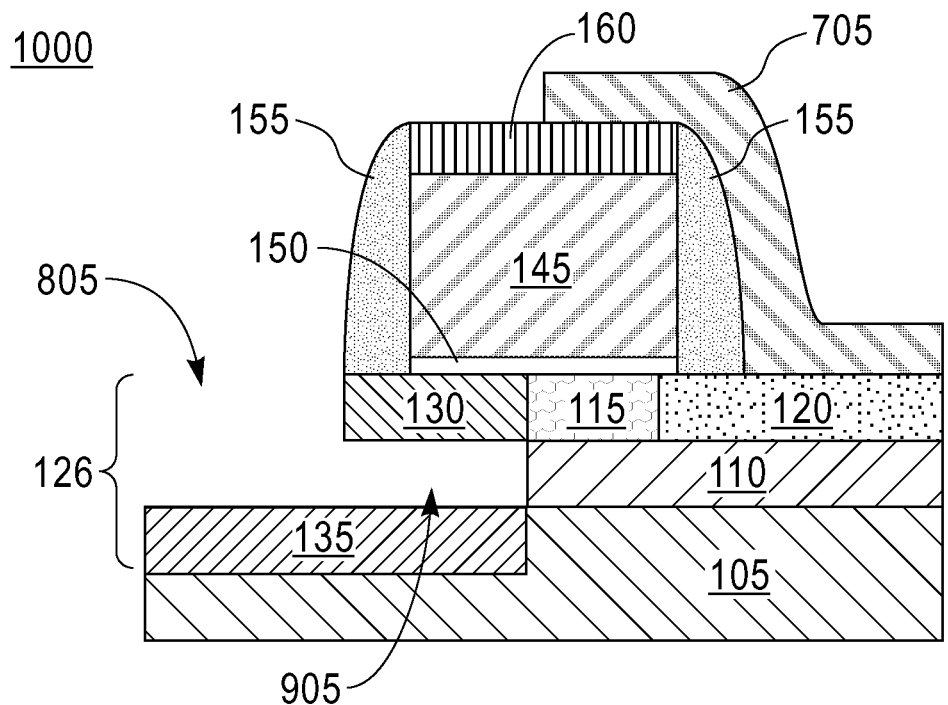
FIG. 10 illustrates an intermediate structure in which a region for a vertical heterojunction has been doped.

At block 520, a region 805 for the vertical heterojunction 126 is doped with a suitable dopant for forming the desirable tunnel path 140. As such, since the drain region is doped n-type in the example, the source region 125 is p-type in a later fabrication step. To form the tunnel path 140, the region 805 for the vertical heterojunction 126 is doped the same as the drain region 120, in this case n-type. The masking implemented at blocks 510 and 515 can be maintained to protect the gate 145, spacers 155, hardmask 160 and drain region 120 from being doped. Additional masking and lithography techniques can be implemented to mask the buried oxide layer 110 in the undercut region 905 from being doped. FIG. 10 illustrates an intermediate structure 1000 in which the region 805 for the vertical heterojunction 126 has been doped. In exemplary embodiments, the semiconductor regions 130, 135 can be formed doping the semiconductor regions 130, 135 with fabrication techniques known in the art. For example, the semiconductor regions 130, 135 can be gas-phase doped with an n-type dopant species with an elements including but not limited to phosphorous, arsenic and antimony. The gas-phase doping can be carried out to attain the desired doping levels of the semiconductor regions 130, 135. As such, the resulting N+ Si the semiconductor regions 130, 135 are formed. In other exemplary embodiments, other doping methods such as atomic layer deposition of a dopant-containing species or the epitaxial growth of a thin layer of highly-doped Si and subsequent out-diffusion of the dopant species can be implemented.

Figure 11:
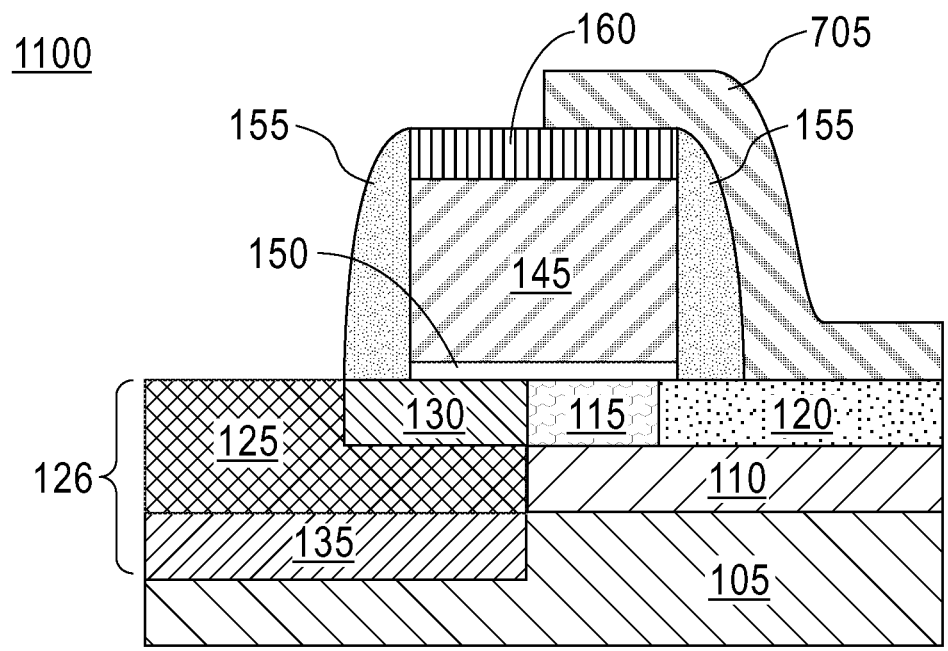
FIG. 11 illustrates an intermediate structure in which a source region has been formed.

At block 525, the source region 125 is formed. As described, since the drain region 120 and the semiconductor regions 130, 135 are doped n-type in the example, the source region 125 is p-type. In exemplary embodiments, the source region 125 can be formed by implementing a chemical vapor deposition (CVD) based epitaxial technique. Furthermore, the material grown by the CVD-based epitaxial technique, such as silicon-germanium (SiGe) can be in-situ doped with a p-type dopant. In addition, the growth can be selective in that the material only grows on Si. As such, in-situ born doped (ISBD) SiGe can be grown as the source region 125. It is appreciated that any other type of p-type dopant can be implemented such as an element for Group IIA including but not limited to aluminum, gallium and indium. The masking implemented at blocks 510 and 515 can be maintained to protect the gate 145, spacers 155, hardmask 160 and drain region 120 from being deposited. As described herein, the hardmask 705 remains in place to prevent SiGe from growing on the drain region 120. In exemplary embodiments, depending on the orientation of the initial silicon wafer used in the SOI base, it is desirable to grow the source region with the same orientation. For example, for (100) wafers, MBE growth at the source region 125 is from a preferred (100) plane. FIG. 11 illustrates an intermediate structure 1100 in which ISBD SiGe has been grown as the source region 125, thereby forming the P+ source region 125 as described in FIG. 1. The hardmask 705 can subsequently be removed. Standard CMOS fabrication techniques known in the art can be implemented to complete the desired structure. As described with respect to FIG. 1, the desirable vertical heterojunction 126 with a tunnel path 140 inline with a gate field is now formed.

Technical effects include a heterojunction at the source that allows a low effective band-gap at the source injection point, while maintaining a high band-gap at the drain side, which suppresses parasitic ambipolar behavior.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a heterojunction tunnel field-effect-transistor (FET), the method comprising:
   forming a gate region on a silicon layer of a silicon-on-insulator (SOI) substrate;
   forming a drain region on the silicon layer adjacent the gate region; and
   etching an undercut through an oxide layer and between the silicon layer and a silicon substrate layer of the SOI substrate to form a vertical heterojunction source region adjacent the gate region,
   doping the silicon layer and the silicon substrate layer with an n-type dopant,
   wherein the vertical heterojunction source region is configured to define a tunnel path that extends parallel with a height of the gate region and is inline with a gate field associated with the gate region,
   wherein forming the vertical heterojunction source region comprises etching through the silicon layer and an insulating layer of the SOI substrate.

2. The method as claimed in claim 1 wherein forming the drain region comprises implanting the drain region with an n-type dopant.

3. The method as claimed in claim 1 further comprising growing a source region between the silicon layer and the silicon substrate layer.

4. The method as claimed in claim 3 wherein the source region is p-type.

5. The method as claimed in claim 1 wherein the vertical heterojunction source region comprises a source region layer disposed between a first and second semiconductor layer.

6. The method as claimed in claim 5 wherein the source region layer is p-type and the first and second semiconductor layers are n-type.

7. The method as claimed in claim 6 wherein the drain region is n-type.

8. A field effect transistor (FET) device, comprising:
a silicon-on-insulator (SOI) substrate;
a gate region disposed on the SOI substrate;
a drain region adjacent the gate region; and
a vertical heterojunction source region adjacent the gate region, the vertical heterojunction source region being doped with a p-type dopant;
a first and second semiconductor layer disposed underneath the gate region, an undercut region formed between the first and second semiconductor layers;
wherein a portion of the source region disposed underneath the gate region is disposed in the undercut region such that the vertical heterojunction source region is configured to define a tunnel path that extends parallel to a height of the gate region and is inline with a gate field associated with the gate region,
wherein the drain region and the first and second semiconductor layers are n-type.

9. The device as claimed in claim 8 wherein the vertical heterojunction source region includes a source region adjacent the gate region.

10. The device as claimed in claim 9 wherein a first portion of the source region is disposed in the undercut region underneath the gate region and a second portion is disposed adjacent and includes an upper surface that is flush the first semiconductor region.

11. The device as claimed in claim 8 wherein the source region is in-situ boron doped silicon-germanium.

\* \* \* \* \*